US006828786B2

(12) United States Patent
Scherer et al.

(10) Patent No.: US 6,828,786 B2
(45) Date of Patent: Dec. 7, 2004

(54) METHOD AND APPARATUS FOR NANOMAGNETIC MANIPULATION AND SENSING

(75) Inventors: Axel Scherer, Laguna Beach, CA (US); Mladen Barbic, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 10/346,811

(22) Filed: Jan. 17, 2003

(65) Prior Publication Data

US 2003/0158474 A1 Aug. 21, 2003

Related U.S. Application Data

(60) Provisional application No. 60/349,613, filed on Jan. 18, 2002.

(51) Int. Cl.[7] .................................................. G01V 3/00
(52) U.S. Cl. ....................................................... 324/300
(58) Field of Search ................................ 324/300, 329, 324/318, 307, 309, 311, 306, 314; 600/410

(56) References Cited

U.S. PATENT DOCUMENTS 6,242,915 B1 * 6/2001 Hurd ........................... 324/309
6,325,904 B1 * 12/2001 Peeters ......................... 257/414

FOREIGN PATENT DOCUMENTS

WO  WO 99/24823  * 6/1999
WO  WO 01/73460  * 3/2001

OTHER PUBLICATIONS

Leonhardt et al. Comparison of Perpendicular and Longitudinal Magnetic Recorsing Using a Contact Write/Read Tester; Oct. 13, 2000; Data Storage System, Carnegie Mellon University, Pittsburgh, PA 15217, USA.*

Vila et al Applied Physics Letters vol. 80, pp 3805–3807, 2002.*

* cited by examiner

Primary Examiner—Brij B Shrivastav
(74) Attorney, Agent, or Firm—Daniel L. Dawes; Myers Dawes Andras & Sherman LLP

(57) ABSTRACT

The invention combines (A) capabilities in fabrication, characterization, and manipulation of single domain magnetic nanostructures, with (B) the use of binding chemistry of biological molecules to modify the magnetic nanostructures into magnetic sensors and magnetically controllable nanoprobes. A biological characterization scheme is realized by combining nanomanipulation and observation of small magnetic structures in fluids. By coating nanomagnets with biological molecules, ultra-small, highly sensitive and robust biomagnetic devices are defined, and molecular electronics and spin electronics are combined. When these nano-sensors are integrated into microfluidic channels, highly efficient single-molecule detection chips for rapid diagnosis and analysis of biological agents are constructed.

23 Claims, 15 Drawing Sheets

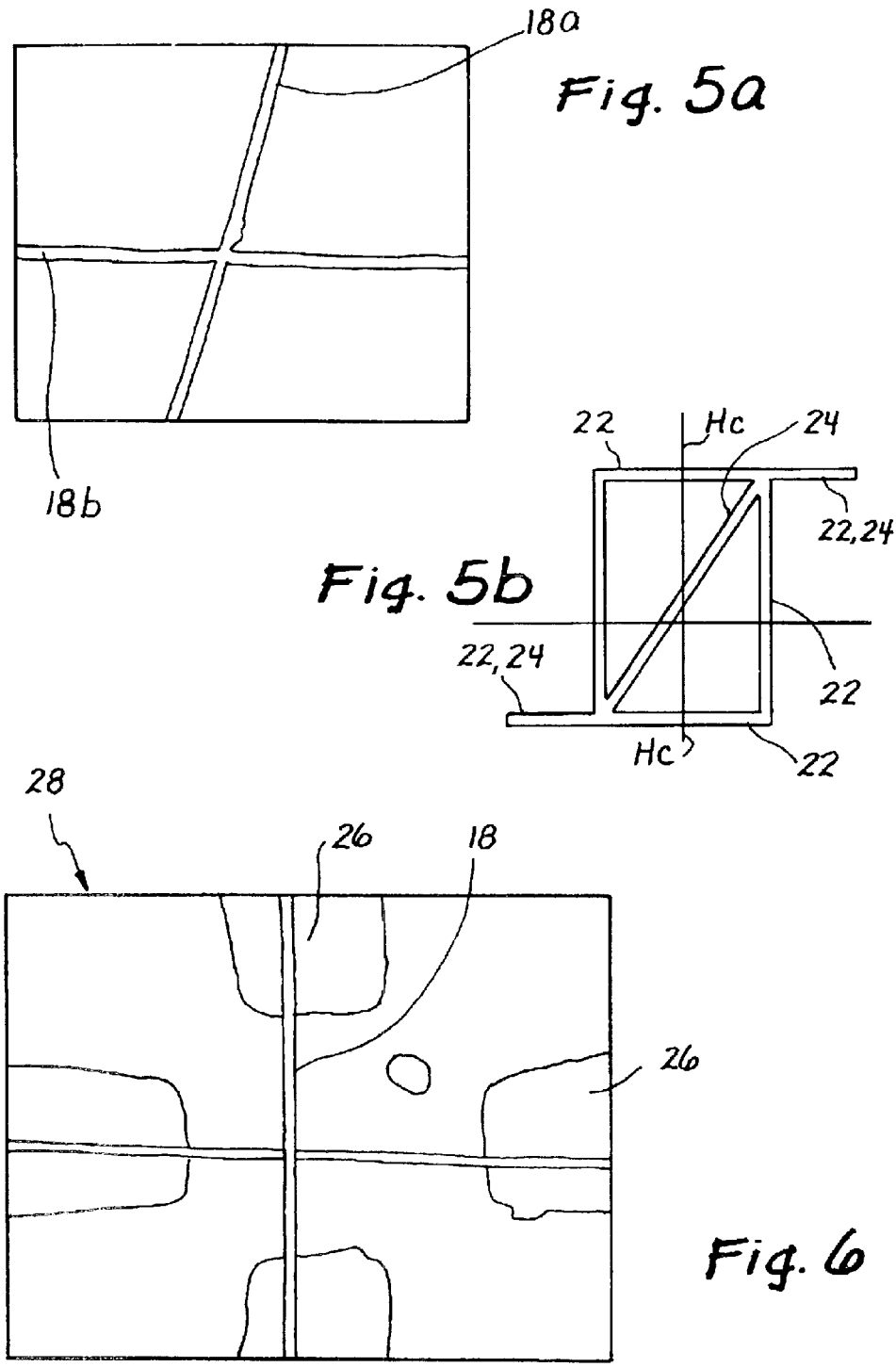

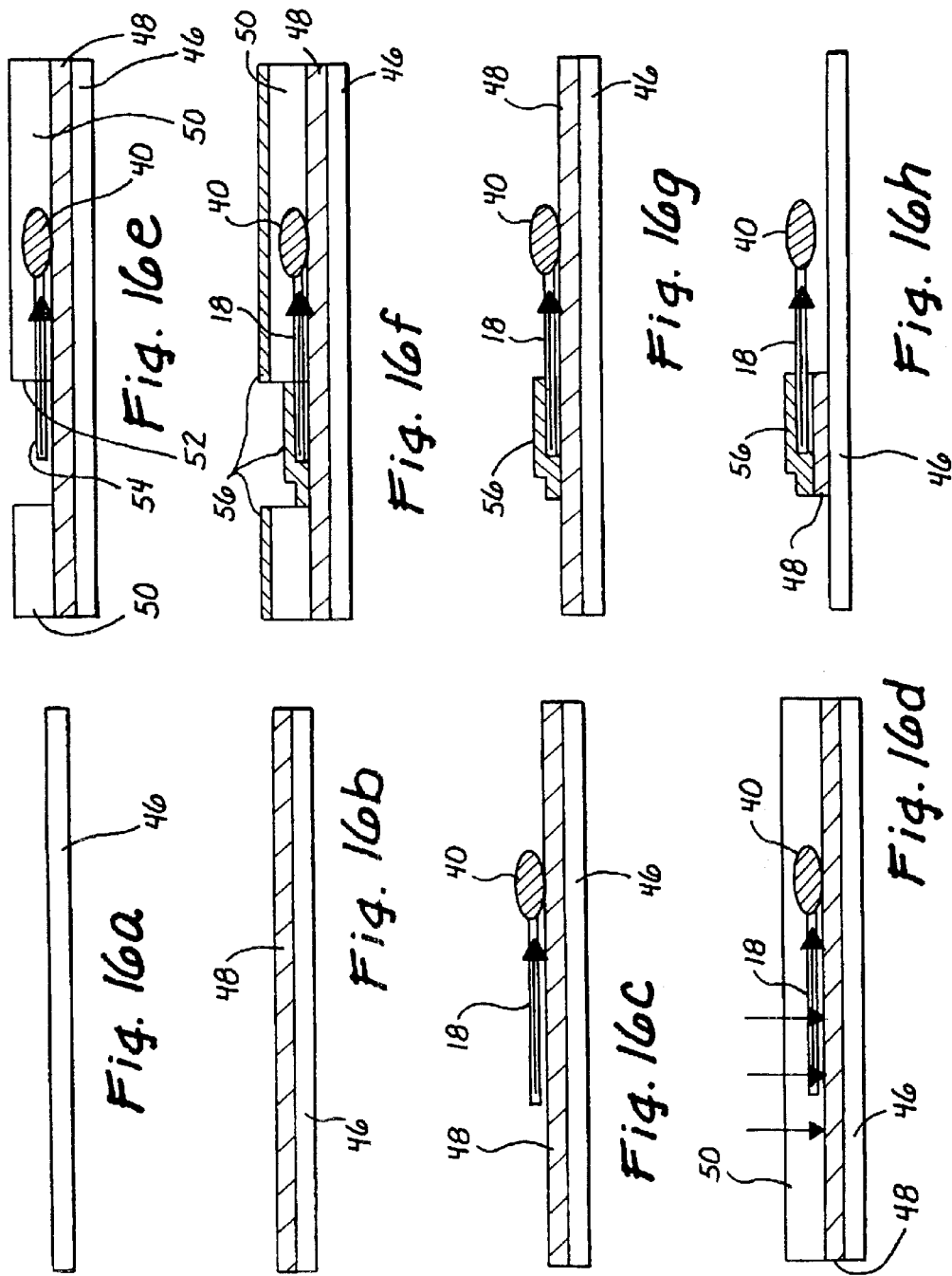

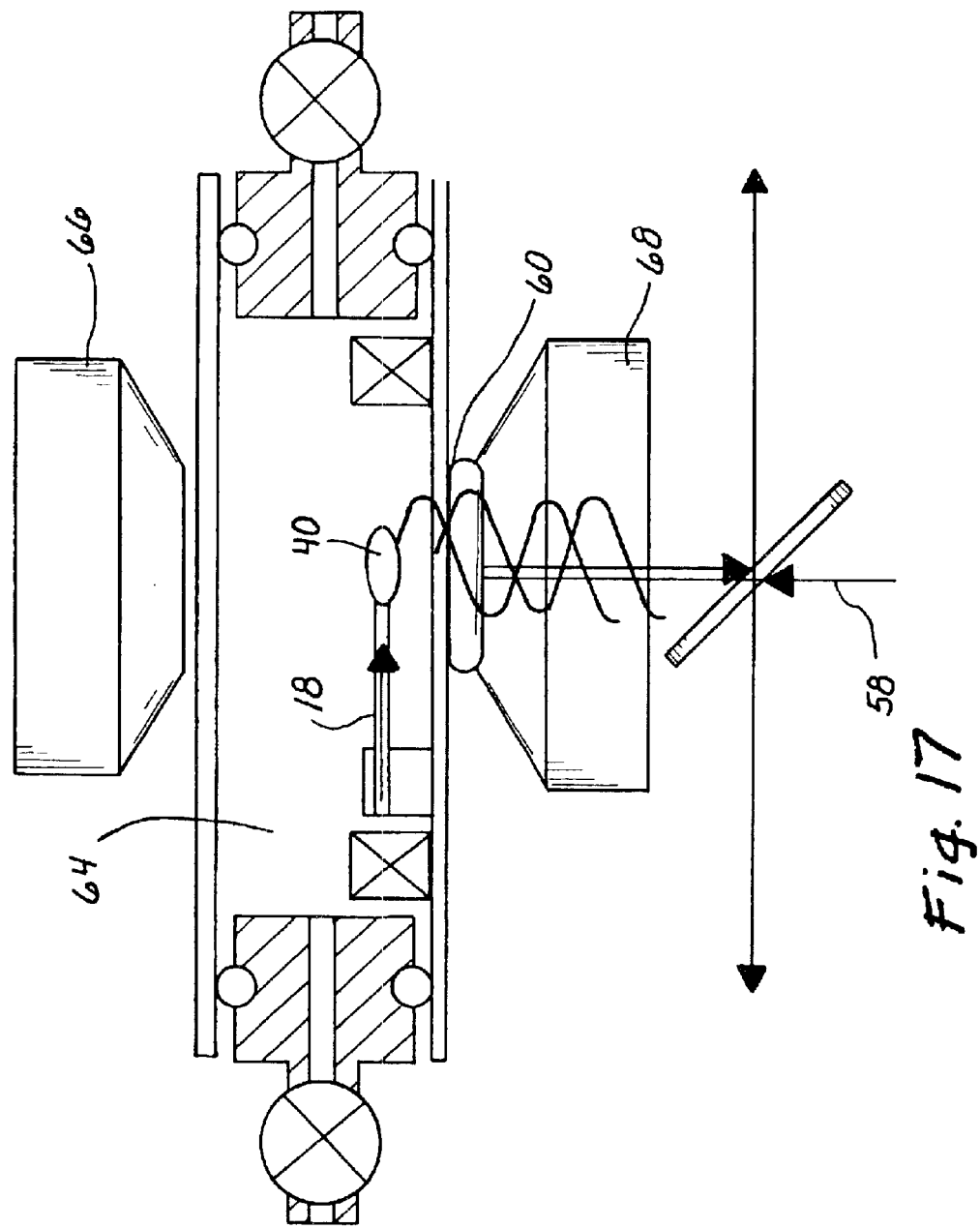

METHOD AND APPARATUS FOR NANOMAGNETIC MANIPULATION AND SENSING

RELATED APPLICATIONS

The present application is related to U.S. Provisional Patent Application Ser. No. 60/349,613, filed on Jan. 18, 2002, which is incorporated herein by reference and to which priority is claimed pursuant to 35 USC 119.

BACKGROUND OF THE INVENTION

1. Field of the Invention

The invention relates to nanomagnets and methods of using nanomagnets for biological problems, such as the detection and manipulation of biological molecules and nanosurgery within cells.

2. Description of the Prior Art

Magnetic nanostructures have in the past been fabricated for dense storage media and compact magnetic sensors. As the focus of biological analysis turns to progressively smaller sample volumes, and eventually to single molecules, efforts in nanomanipulation, characterization, and local sensing of biological materials become increasingly important. The integration of nanomagnetic devices into biological research instrumentation will provide powerful new capabilities for sensitive, compact and efficient bio-sensing.

Consider first recent advances in magnetic manipulation technology. Within the past 20 years, the micromanipulation and characterization of objects ranging in size from atomic to micrometer dimensions has become one of the central goals of modern science. Scanning tunneling microscopy and atomic force microscopy enable surface imaging with atomic resolution, as well as atomic manipulation in many environments. Optical trapping methods have also become routine for the manipulation of micron-sized latex spheres attached to objects of biological interest. Similarly, carbon nanotubes are utilized for physical tweezing of micro-objects. Magnetic tweezers have more recently also been applied to the study of the physical properties of the cytoplasm, mechanical properties of cell surfaces, and elasticity and transport of single DNA molecules For cell studies, most of these techniques rely on the micromanipulation of magnetic particles positioned within a cell wall or bound on the surface of a cell. For single molecule investigations, magnetic particles are attached onto one end of a molecule strand. In all of these studies, micromanipulation is typically performed with a magnetic manipulator consisting of permanent or soft coil-wound magnets with macroscopic dimensions.

Nanofluidic chips have been developed in which subnanoliter fluid volumes can be manipulated and biochemical assays performed. See, Unger M. A. Science V. 288, pp 113 (2000). These fluidic circuits can be monolithically integrated with optoelectronic sensors to enable the rapid analysis of 10 pL fluid volumes. Thousands of valves and pumps, made in silicone elastomer, have been aligned onto micro-optic chips such as light emitters or silicon CMOS detector arrays to form nanofluidic analysis systems. The integration of optoelectronics with microfluidics has thus allowed the construction of very compact nanofluidic test systems, where the fluidic structures are inexpensive and disposable. The resulting multifunctional biosensor chips are very compact and can concentrate and measure pathogens or toxins as well as deliver drugs. In turn, these nanofluidic systems are ideal for extracting, delivering and holding single cells for high resolution cellular magnetic resonance imaging (cMRI) and for the manipulation of magnetic nanoprobes.

BRIEF SUMMARY OF THE INVENTION

The invention is a new synergy between biology and magnetic nanostructure design by combining (A) capabilities in nanofabrication, characterization, and manipulation of single domain magnetic nanostructures, with (B) the use of binding chemistry of biological molecules to modify the magnetic nanostructures into magnetic sensors and magnetically controllable nanoprobes. The biological characterization scheme of the invention combines nanomanipulation with the observation of small magnetic structures in fluids. These capabilities allow the construction of fundamentally new magnetic nanostructure geometries that are not easily fabricated by conventional high resolution lithographic methods. By coating nanomagnets with biologically interesting molecules and using the approaches detailed below, ultra-small, highly sensitive and robust biomagnetic devices are defined, and molecular electronics and spin electronics are combined. When these nano-sensors are integrated into microfluidic channels, highly efficient single-molecule detection chips for rapid diagnosis and analysis of biological agents are constructed.

As described below a tool is provided to remotely control the position of magnetic nanoparticles, to pattern magnets lithographically onto chips for magnetic self-assembly, and to suspend magnetic wires into cantilevers. By combining these capabilities, a new generation of sensors and imaging instruments is made possible. These structures are especially useful for the nano-manipulation of magnetic probes in-situ within living biological systems, namely performing nanosurgery within cells or within nanofluidic channels, since the magnets can be remotely actuated and controlled by nanocoil probes as described below in connection, which nanocoil probes locally concentrate magnetic fields.

Together with surface plasmon scatterers, which can be attached to the magnetic nanoparticles, the control coils can be used to move magnets within fluids and optically monitor their precise location without the scattering, heating and bleaching often encountered when using optical tweezer technology.

Moreover, magnetic attraction can be used to self-assemble tunnel junctions and define sensitive nanomechanical structures where magnetic forces can be externally applied to add mechanical gain to cantilevers and increase the effective Q of nanomechanical resonators.

Together with our microfluidic tools to hold biological specimens, miniaturized coils are ideally suited for improving the imaging resolution of cMRI systems for cell development studies, since nanocoils can operate at high frequencies and can establish large gradient fields.

In the illustrated embodiment nanomagnetic and nano-optic manipulators and sensors are combined with the previously developed with microfluidic design technology discussed above. What results is the highest resolution magnetic resonant imaging systems yet devised to date, with an ability to manipulate magnetic nanoparticles and trigger biological reactions within a cell. Further, the highest resolution nano-mechanical resonator sensor built to date for detecting electron spin is realized.

One illustrated embodiment of the invention is a magnetic nanoprobe for use in magnetic micromanipulation comprising a micron-sized soft-ferromagnetic wire serving as a magnetic core, a micron-sized coil wound around the magnetic core, and a sharp tip defined on a distal end of the magnetic core.

In one embodiment the micron-sized coil is comprised of at least two layers of wire coils. The micron-sized magnetic core has a diameter of 100 μm or less, the micron-sized coil is comprised of magnet wire having a diameter of 50 μm or less, and the sharp tip defined on a distal end of the magnetic core is formed by electrochemical etching.

The invention can also be described in another embodiment as a method comprising the steps of providing a biofunctionalized magnetically interactive nanoparticle, disposing the biofunctionalized magnetically interactive nanoparticle into a cell, and manipulating the magnetically interactive nanoparticle in the cell by means of a magnetic nanoprobe to interact with intracellular processes.

The invention is also embodied as a nanoelectromagnetic mechanical apparatus comprising a plurality of nanoprobes combined to form a nanoelectromagnet assembly and at least one magnetic nanowire disposed proximate to the nanoelectromagnet assembly and electromagnetically coupled thereto.

The nanoelectromagnetic mechanical apparatus in one embodiment can be embodied as a nanomotor where the nanoelectromagnet assembly is arranged and configured to serve as a stator, and where the nanowire serves as a rotor. In another embodiment the nanoelectromagnet assembly is arranged and configured to serve as a solenoid coil, and where the nanowire serves as an actuator. In still another embodiment the nanoelectromagnet assembly is arranged and configured to serve as a relay coil, and where the nanowire serves as a relay contact.

The invention is further embodied as an apparatus for providing a nanogap point contact comprising a first magnetic nanowire having at least one associated electrical contact, and a second magnetic nanowire disposed askew to the first magnetic nanowire to form a crossing therebetween and having at least one associated electrical contact. The first and second nanowires touch or nearly touch each other at the crossing, so that magnetoresistance between the first and second nanowires can be measured.

At least one of the first and second nanowires is covered with a molecular substance, whose spin transport properties is to be measured, namely a thin film of the molecular substance.

In one embodiment the crossing of the first and second magnetic nanowires is approximately at right angles and their touching or near touching comprises a point contact. The point contact is capable of single molecule interrogation. The first and second magnetic nanowires are each single domain magnets.

The first and second magnetic nanowires each have a longitudinal axis and the single domain magnets are oriented along the longitudinal axis at zero applied magnetic field. The apparatus further comprises a source of an external applied magnetic field and wherein one of the first and second magnetic nanowires has its longitudinal axis substantially perpendicular the external applied magnetic field.

In still yet another embodiment the invention is an apparatus for providing a nanogap comprising a first magnetic nanowire having at least one associated longitudinal length, and a second magnetic nanowire having at least one associated longitudinal length, the second magnetic nanowire disposed substantially parallel to the first magnetic nanowire by at least in part magnetic self-assembly to form the nanogap between at least a portion of their longitudinal lengths. The first and second nanowires touch or nearly touch each other.

An electrical contact is coupled to each of the first and second nanowires, such that the nanogap between them forms and may be used as an electron tunneling junction. The nanogap is approximately 10 nm across or less. In such an embodiment the apparatus may further comprise a coating of a molecular substance of interest on at least one of the first and second magnetic nanowires so that the electron tunneling junction is formed through the molecular substance of interest. The first and second nanowires may further be comprised of sections of longitudinally sequential plating of with magnetic and nonmagnetic material to assist in control of the magnetic self-assembly. For example, the first and second nanowires in one embodiment are comprised at least in part of gold or silver for enhanced molecular Raman signals when aligned, namely a sequential electrodeposition of nickel, silver or gold and nickel portion. Again, a coating of a molecular substance of interest may be disposed on at least one of the first and second nanowires, including at least part of the silver or gold portion.

In another embodiment the invention is an improvement in an apparatus for performing magnetic resonance force microscopy comprising a nanowire cantilever resonator, and a metal colloidal nanoparticle coupled to the nanowire cantilever resonator as an optical nano-reflector to assist in vibration detection by the apparatus. The apparatus includes a light source, and a source of an external magnetic field, so that the nanowire cantilever resonator comprises a cantilevered magnetic nanowire and the metal colloidal nanoparticle comprises a silver nanosphere attached to the nanowire whereby an increased scattering cross section of the metal colloidal nanoparticle due to its plasmon resonance when illuminated by light renders vibration of the cantilevered magnetic nanowire visible when driven by the external magnetic field. In the illustrated embodiment the cantilevered magnetic nanowire is 50 nm in diameter or less. In one implementation the nanowire cantilever resonator comprises a nonmagnetic nanowire as its proximal portion fabricated with a single domain magnetic nanowire as its distal portion for generation of an ultra-high gradient magnetic field for single spin selection or force detection.

The invention is still further defined as an improvement in an apparatus for performing magnetic resonance imaging (MRI) wherein an MRI imaging coil assembly comprises a first fiber, a second fiber disposed parallel to and proximately adjacent to the first fiber, and at least one coil magnet wrapped on each of the first and second fibers so that at least two coils are approximately parallel and adjacent to each other to provide a high gradient magnetic field. Preferably at least two coil magnets are wound on each fiber and serially coupled together as a pair of coil magnets. Each pair is wound and oriented on its corresponding fiber to provide opposing fields to the adjacent pair of magnet coils. The two imagining directions are provided with the MRI imaging coil assembly. The MRI imaging coil assembly generates a magnetic gradient of the order of 100,000 Gauss/cm.

The invention is also defined as an improvement in an apparatus for performing magnetic resonance imaging (MRI) using scanning probe microscopy comprising a cantilevered fiber, a microcoil wound on an end of the fiber, and a magnetic nanoparticle coupled on the fiber and magnetically coupled to the microcoil for generating high gradient imaging magnetic fields. In the illustrated embodiment the magnetic nanoparticle is ferromagnetic.

In another embodiment the fiber is a capillary tube filled with ferromagnetic material. The capillary tube is 25 microns in diameter or less and the microcoil is 50 microns in diameter or less.

The invention is also to be understood as including within its scope methods for using each of the foregoing apparatus or improvements.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 5a is a top plan view of a pair of metallic nanowires manipulated to form a magnetic probe for spin transport.

FIG. 5b is a graph of the hysteresis loop of the device shown in FIG. 5a.

FIG. 6 is an atomic point contact device with electrical contacts at each end of the nanowires.

FIG. 9a shows the fabrication of the three-part nanowires in a porous membrane. FIG. 9b shows their magnetic self-assembly. FIG. 9c shows the enhanced Raman effect from one of such pairs of magnetically aligned nanowires.

FIG. 10b is a transmission electron microscopic photograph of the silver nanoparticles of FIG. 10a.

FIG. 14b is the schematic of an equivalent circuit of the nanowire resonator of FIG. 14a.

FIGS. 16a–16h are a series of side cross-sectional view illustrating the fabrication of a nanowire resonator.

FIG. 17 is a diagram of the sensor in a magnetic resonance force microscope.

The invention and its various embodiments can now be better understood by turning now to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Four distinct but related applications are disclosed, namely subcellular particle manipulations using nanoprobes; point contact nanosensors; sensors capable of providing submicron magnetic resonance imaging; and plasmon based spin detectors with single electron spin detection capability. These are broadly described as the following four applications of technology.

Figure 1:
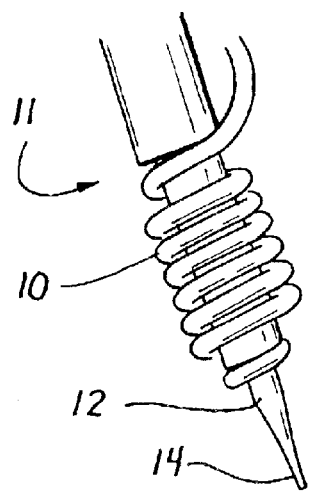
FIG. 1 is a side elevational view of a magnetic manipulator.

First, the position of biofunctionalized magnetic nanoparticles, i.e. nano-sized objects which are comprised of or coated with a bioactive molecule or substance, are accurately manipulated with nanoprobes 11 of FIG. 1 to change or probe the local chemistry, to influence reactions, and to trigger changes in the metabolism of a single cell. Rather than introducing an AFM tip into such systems, nanoprobes 11 are manipulated remotely within living cells, and rather than optically moving such objects, optics is used only to read out the position of nanoprobes 11.

Second, magnetic nanowires 18 can also be used to form intersecting metal point contact junctions as shown in FIG. 5a which can be conveniently self-assembled onto prepatterned substrates with magnetic contacts. Magnetic attraction is used to form nanometer-sized tunnel junctions that enable the measurement of individual molecules and even to perform spin injection experiments through such molecules. Nanocoils can be used in state of the art NMR systems to significantly improve the resolution and enable cellular biologists insight into the cell function.

Figure 13A:
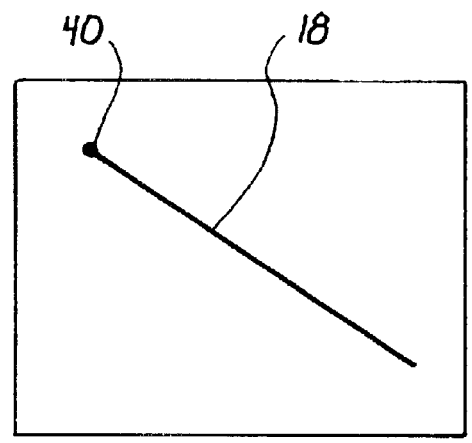
FIG. 13a is a scanning electron microphotograph of a nanowire tipped with a plasmon resonant nanoreflector.
Figure 13B:
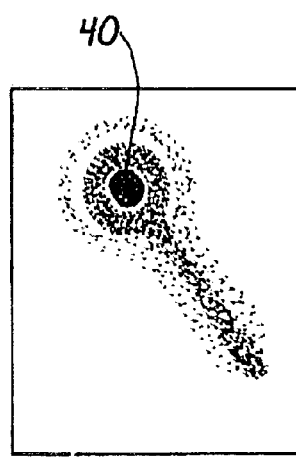
FIG. 13b is an optical image of the nanowire of FIG. 13a illustrating the enhanced reflectivity.

Third, magnetic nanowires 18 can also be attached to gold or silver plasmonic nanoparticles 40 as shown in FIG. 13b, and the coils are used to move these very efficient scatterers within a solution to locally quench or enhance fluorescence.

Fourth, nanomagnetic probes combined with such integrated plasmon scatterers also enable the definition of very small nanomechanical cantilever sensors with high mechanical gain, which can be remotely controlled by using nanocoil probes as shown in FIG. 17. This capability is especially useful in fluidic environments where dampening of the mechanical motion can thereby be actively compensated.

Consider now the first of these areas of application, namely nanomanipulation.

Nano-Manipulation of Magnetic Particles

Figure 2:
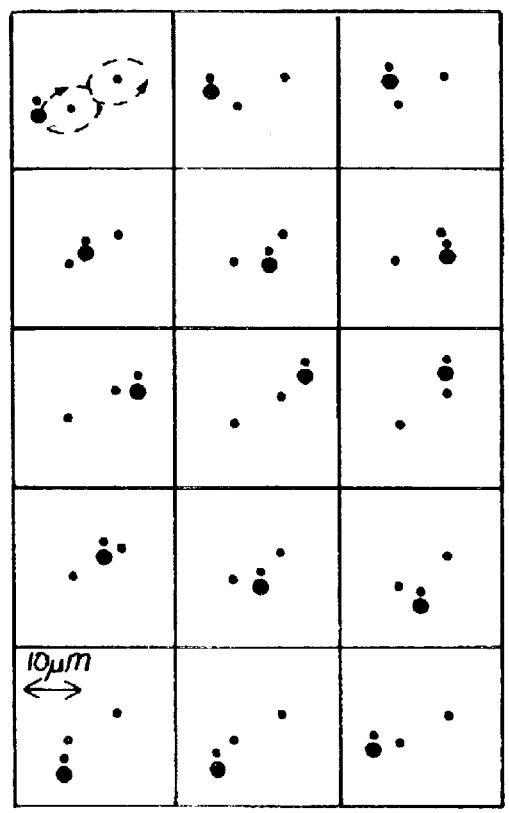
FIG. 2 is a series of images whereby a magnetic manipulator of FIG. 1 is used to move a magnetic nanobead in a figure-of-eight pattern.

The illustrated embodiment describes a magnetic micro-manipulation technique that utilizes probes 11 in which microcoils 10 are integrated with magnetic microtips 14 for micropositioning of small magnetic objects as shown in FIG. 1 and demonstrated in the plurality of images comprising FIG. 2. Unlike optical tweezers, "magnetic tweezers" or probe 11 can exert strong forces on small metal particles without heating, scattering or bleaching of fluorescent material in their vicinity.

A typical magnetic manipulator or probe 11 is shown in FIG. 1, and is fabricated by winding a 25 $\mu$m diameter copper magnet wire 10 around a 50 $\mu$m diameter soft-ferromagnetic wire 12 serving as a magnetic core. The preferred winding design is comprised of two coil layers with 6–8 turns each. In order to create high field gradients, the soft ferromagnetic wire 12 is electrochemically etched to form a sharp probe 14, and then positioned in the vicinity of the coil 10, as seen in FIG. 1, in order to be optimally magnetized by the corresponding coil fields. These microcoil assisted ferromagnetic micro-tips 14 provide sufficient magnetic forces for tweezers applications, since the forces on the magnetic bead depend on the field dependent magnetization of the bead, and the magnetic field gradient at the bead. Since the magnetic field from a coil 10 is inversely proportional to the coil diameter, and the field gradient from a ferromagnetic tip 14 is inversely proportional to the tip dimensions, minimization of both of these dimensions is very advantageous. Probe 11 itself is manipulated with a conventional micromanipulator, such as a piezoelectric stage.

As a graphic demonstration of the sub-micron positioning resolution capability of the scanning probe electromagnetic tweezers of FIG. 1, FIG. 2 a composite of successive images of a 2.8 $\mu$m magnetic bead, which is manipulated by the probe of FIG. 1 to trace a "figure of eight" around the two 1 $\mu$m diameter non-magnetic beads separated by 9 $\mu$m. The capability of controlling the position and orientation of magnetic nanoparticles through a remote piezo-electrically controlled nanocoil is expected to become very useful in understanding the role of cytoplasmic enzymes, which can be spatially and temporally brought into dose proximity with active signaling centers. Changes in fluorescence color, as well as cell responses and changes in cellular development can be monitored after modification of cells with nanomagnetic probes.

The most important advantages of magnetic positioning over the more conventionally used optical tweezing techniques include the high forces which can be exerted on small magnetic particles and the distance over which particles can be controlled. Optical tweezers often cannot counteract the forces on nanoparticle, which arise naturally in the cell, and the precise positioning of such particles is therefore quite difficult. Furthermore, the high numerical aperture objective which must be used for optical tweezer positioning of nanostructures limits the focal length to 10–30 micrometers, which in turn complicates the application of optical positioning technology within our integrated nanofluidic systems. Nanocoil manipulation does not suffer from such severe focal distance limitations and can be used to exert large forces onto magnetic nanoparticles, and nanomanipulation becomes feasible even within standard microfluidic chips.

Figure 3:
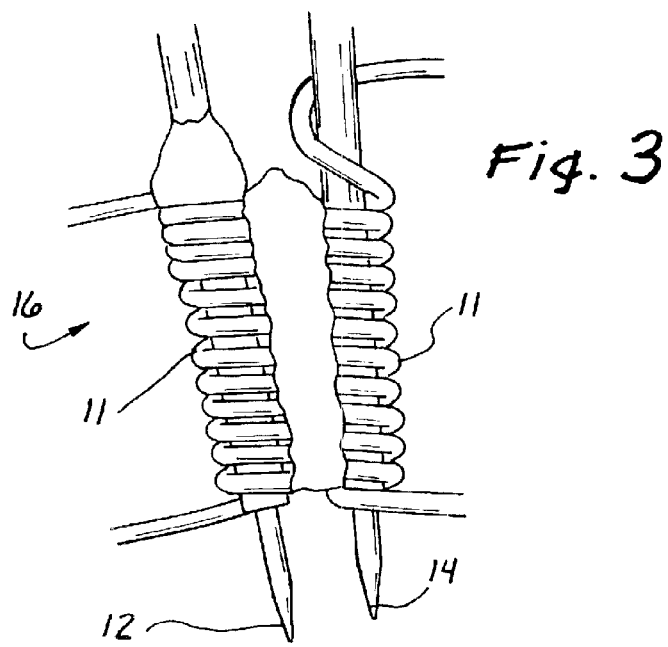
FIG. 3 is a side elevational view of three magnetic microcoils combined to form a magnetic stator.

Manipulation of spherical magnetic objects by the micro-manipulator 11 of FIG. 1 can also be extended to the more complex manipulation of a magnetic nanowire 18 in a fluid, such as in the construction of a micro-fluidic motor or stir-bar. By arranging three micro-manipulator coils 10 and corresponding tips 14 in an equilateral triangle, two of which micro-manipulators 11 are shown as shown in FIG. 3, a three-phase stator is defined which is collectively denoted by reference numeral 16, which can be used to rotate an individual single domain nanowire 18 placed in a fluid which nanowire 18 as shown in the composite FIG. 4 which nanowire 18 acts as the rotor in a manner identical to a conventional electrical motor.

High aspect ratio metallic nanowires 18 are conveniently created by synthetic methods through the preparation of nanoporous templates, and by subsequently filling the pores in a conventional manner, such as described by C. R. Martin, *Science* 266, 1961 (1994). Examples of high aspect ratio nanoporous substrates include nanochannel glass membranes, anodized aluminum films, and ion-implanted polymer membranes. Filling of the pores within such membranes with high aspect ratio metal nanowires 18 is typically accomplished by either conventional high-pressure metal melt injection or electrodeposition.

Figure 4J:
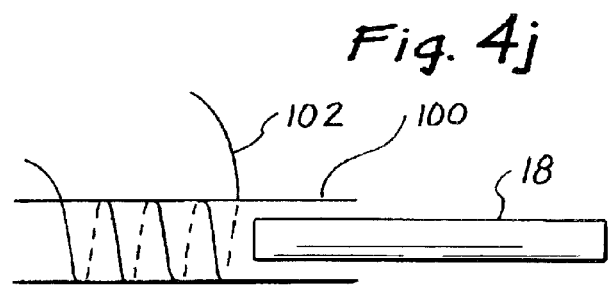
FIG. 4j is a diagram of a nanosolenoid.
Figure 4K:
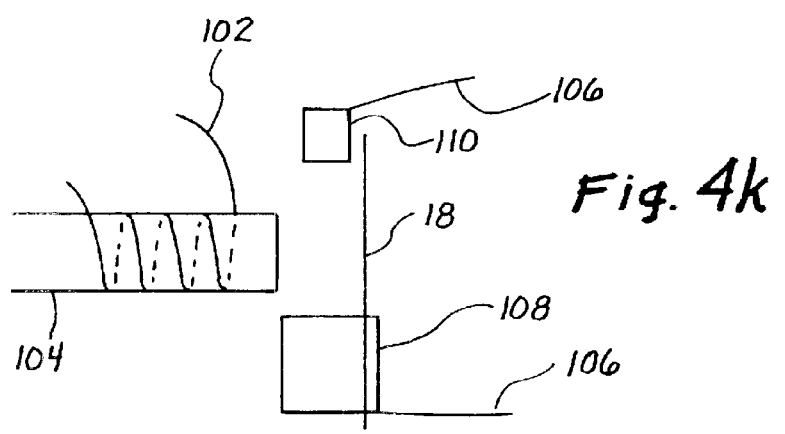
FIG. 4k is a diagram of a nanorelay.
Figure 4A:
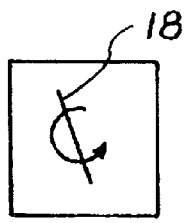
FIGS. 4a–4i is a series of images whereby the magnetic stator of FIG. 3 is used to rotate a magnetic nanowire serving as a rotor.
Figure 4B:
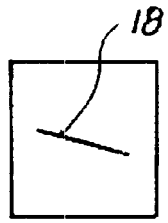
Figure 4C:
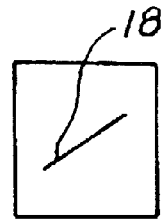
Figure 4D:
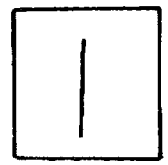
Figure 4E:
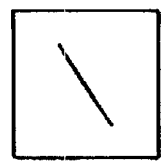
Figure 4F:
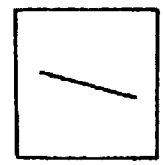
Figure 4G:
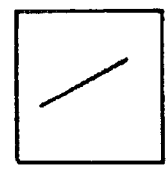
Figure 4H:
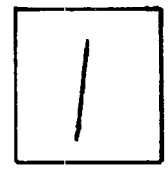
Figure 4I:
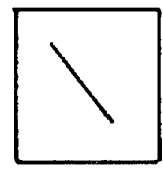

When micro-coils 10 of the stator 16 are individually connected to separate current amplifiers controlled by independent digital-to-analog converter computer-driven channels, the control channels can be programmed so that the electric currents through the three micro-coils are sinusoidally varied with a 120° phase difference. This arrangement of the currents provides sinusoidally attractive and repulsive forces to the magnetic nanowire 18, resulting in a rotating motion. FIGS. 4a–i shows a composite sequence of images demonstrating one full rotation of the nano-magnet rotor 18. Other types of nanodevices are possible as well, such as the nanosolenoid in FIG. 4j and the nanorelay in FIG. 4k. In FIG. 4j microcoil 102 is wound on a capillary tube 100 into which is sliding disposed a magnetic nanowire 18 which serves as a plunger. In FIG. 4k microcoil 102 is wound on an optic fiber or soft ferromagnetic wire 104 and positioned adjacent to a conductive magnetic nanowire 18 cantilevered from a contact pad 108 and extending to an opposing contact pad 110, which pads 108 and 110 are coupled to leads 106. It can be understood that magnetic nanowires 18 can be readily employed in many other types of electromagnetic devices simulative or not of larger scale electromagnetic devices.

Point Contacts between Nanowires

The disclosed nanowire fabrication technology is used in the invention to accurately position the resulting magnetic structures and construct magnetic probes for spin transport as illustrated in FIG. 6. In the simplest geometry, magnetotransport measurements can be conducted by touching two magnetic wires 18a and 18b through a point contact 20 as depicted in FIG. 5a. Such structures allow highly sensitive magnetic field measurements.

If molecules of interest are now introduced between the two nanomagnetic wires 22 into the magnetic point contact 24, reproducible spin-transport signatures from the molecules are generated. These transport signatures are altered by chemically reacting these interrogated molecules. The investigation of spin transport through multi-layer magnetic films has been the subject of intense research and has yielded rich physics, fueled by the availability of sophisticated experimental methods for the studies of artificially prepared magnetic nanostructures. Probe 28 of FIG. 6 can be used to investigate spin transport through magnetic films.

The magnetic point-contacts 20 described here, which have only recently been proposed, can be used as unique magnetic nanostructure sensors in which conduction is dominated by the spin configuration and magnetoresistance potential. Such nanostructures provide excellent local biomagnetic probes and permit single molecule interrogation. Preliminary experimental magnetic point contact conductance measurements indicate that a very large magnetoresistances can be obtained in the geometries of FIG. 6, and suggest that high sensitivities are achievable.

Magnetic point contacts have been a topic of mesoscopic physics research for some time, but nanoscale point contacts have been traditionally difficult to fabricate with adequate uniformity and size. Magnetic nanomanipulation is used to fabricate nanoscale point contacts formed between narrow magnetic nanowires 18a and 18b. FIG. 5a shows a transmission electron micrograph of a magnetic nanowire cross point contact 20 constructed from two single domain nickel nanowires 18a and 18b, which are 25 nm in diameter. Since nanowires 18a and 18b were fabricated by electrodeposition of nickel into cylindrical nanopores, they have a circular cross section, and therefore the interface between the two perpendicularly oriented nanowires reproducibly forms a single point contact 20.

This single domain magnetic property of nanowire 18a, 18b enables the precise tuning of the magnetic configuration of point contact 24. The resulting hysteresis loop 22 of nanowire 18a as shown in FIG. 5b, which here is assumed to be aligned with the applied magnetic field direction is to be square, and magnetization of wire 18a does not change if the applied magnetic field is smaller than the coercive field. The hysteresis loop 24 of nanowire 18b perpendicular to the magnetic field is linear in the range between the two coercive magnetic field values, and the relative magnetization between the two magnetic nanowires 18a and 18b can be tuned in a linear fashion during magneto-transport measurement of the point contact 20.

Secondly, the single domain nature of the nanometer scale magnetic nanowires 18a and 18b ensures that the magnetization is oriented along their long respective axes at zero magnetic field. This allows for magnetic tuning of the magnetic point contact 20. Since the hysteresis loop 22 of the nanowire 18a aligned with the magnetic field is square as shown in FIG. 6, the magnetization of wire 18a does not change if the applied magnetic field is smaller than the coercive field, Hc. Since hysteresis loop 24 of the nanowire 18b perpendicular to the magnetic field is linear in the range between the two coercive magnetic field values, Hc, the relative magnetization between the two magnetic nanowires 18a and 18b can be tuned in a linear fashion during the magnetotransport measurement at point contact 20.

Finally, theoretical considerations predict that magnetoresistance of magnetic point contacts 20 should reach an extraordinarily high value of 1,000%. This is further compounded by the fact that the effective size of the nanowire point contact sensor or probe 28 shown in FIG. 6 is on the order of 5 nm$^2$.

As described in Bila, L., "*Multiprobe Magnetoresistance Measurements on Isolated Magnetic Nanowires,*" Appl. Physics Letters V. 80, No. 20, pp. 3805 (2002) it is well known how to place electrical contacts on nanowire point contacts 26 with excellent precision as shown in FIG. 6 by using high-resolution electron beam lithography, to convert nanowire point contact 20 into an electrically connected sensor assembly 28. This capability of nanofabrication and manipulation of novel magnetic nanostructures opens a possibility for spin transport investigation of systems that have never previously been explored, such as molecules, fullerenes, and particles small enough to exhibit quantum behavior, called quantum dots.

As the focus of biological analysis and mesoscopic physics turns to progressively smaller sample volumes, and eventually to single molecules, individual carbon 60 molecules and quantum dots, efforts in nanomanipulation, charac sensing of such systems become increasingly important. The open architecture of the magnetic nanowire assemblies will allow us to for the first time to explore the spin transport probing of these systems that were previously been characterized only by standard electronic methods, while spin the component of the electric transport has not been investigated. The fabrication, characterization, and manipulation of single domain magnetic nanostructures are combined with the use of binding chemistry of biological molecules to modify magnetic nanostructures into magnetic sensors and magnetically controllable nanoprobes 28. By coating nanomagnets 18 with biologically interesting molecules, ultra-small highly sensitive and robust biomagnetic devices can be defined, and molecular electronics and spin electronics are combined.

Electron spin transport properties of molecular systems is investigated using the nanostructures or probe 28 shown in FIG. 6. The nature of the resulting nanostructure is such that the conduction between the two nanowires 18a and 18b has to occur through the molecular system bound to the nanowires 18a and 18b. In these probes 28, where the source and drain in this construction are magnetically tuned through an applied external field by using the hysteresis loops of FIG. 5b, spin transport spectroscopy can be conducted only through analyte molecules.

In addition, the relatively open structure of the crossed nanomagnet point contact sensor or probe 28 makes this structure ideally suitable for chemical analysis. With the tunable and well-understood magnetic properties of single domain magnetic nanowires 18, their nanomanipulation, assembly, and integration with high resolution electron beam lithography techniques, it becomes possible to integrate these seemingly incompatible systems into a unique experimental configuration for a truly novel spin transport investigations. The same principle applies to integrating quantum dots, fullerenes, and colloids into the gap region between the magnetic nanowires 18a and 18b, and performing spin transport spectroscopy of such systems as well.

Figure 7A:
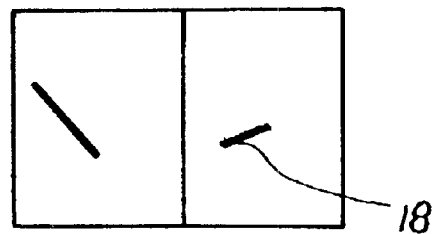
FIGS. 7a–7d is a series of images showing the manipulation and then self-assembly of two nanowires to form two oppositely magnetized nanowires.
Figure 7B:
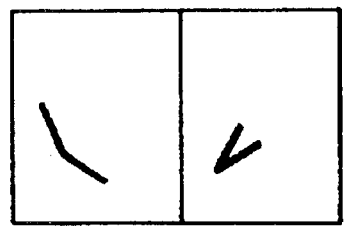
Figure 7C:
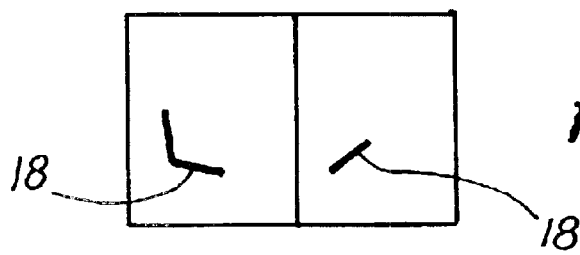
Figure 7D:
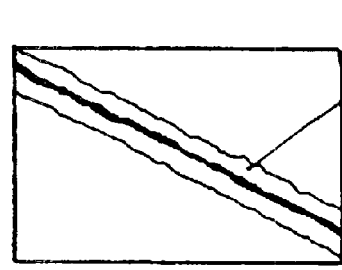

By manipulating magnetic nanowires 18a and 18b into a different geometry, the natural magneto-static interaction between two parallel nanomagnets can be exploited. The magnetic attraction between nanowires 18a and 18b is used for self-assembly of very narrow nano-gaps. FIGS. 7a–d show a sequence of images of two magnetic nanowires 18a and 18b brought into contact with each other using the previously described magnetic manipulator. While the initial manipulation is performed by external means using the magnetic manipulator of FIG. 1, the final assembly of the nanostructure is completed by the attractive magnetic forces between the two oppositely magnetized nanowires 18a and 18b. FIG. 7d shows a high-resolution bright field TEM image of the two 30 nm diameter nickel nanowires 18a and 18b magnetostatically forming a parallel pair.

This parallel wire geometry is again a unique structure and provides a very elegant method for generating metallic electron tunneling devices. It is very difficult to fabricate a similar system of two parallel conductors, with long aspect ratios separated by an approximately sub-10 nm narrow tunneling gap, by conventional lithography. Thus by utilizing the (a) magnetostatic attraction between magnetic nanostructures or wires 18a and 18b, (1,) the single domain nature of the nanowires 18a and 18b, and (c) the very high magnetic fields between these magnets, we can again study magneto-electronics and molecular electronics. Magneto-resistance measurements are preformed using geometry by placing contact pads onto the ends of the magnets or wires 18a and 18b and measuring the tunneling characteristics of the resulting device. The magneto-resistance of biological molecules coated onto one of the wires 18a and 18b was also measured. Again, we can measure the conductivity of a tunnel junction similar to the one shown in FIG. 7d.

Figure 8:
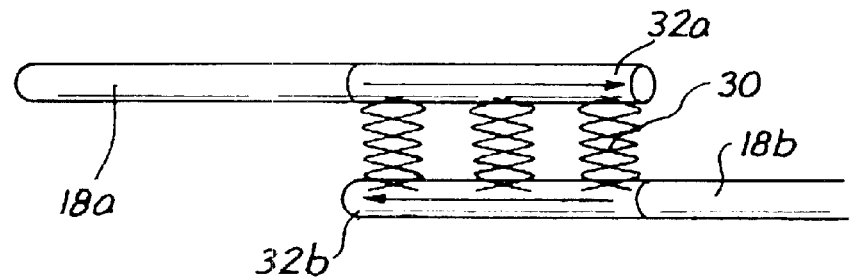
FIG. 8 is a diagrammatic side view showing sequential plating of magnetic and nonmagnetic metals.

Since the parallel nanowires 18a and 18b are separated by only a few nanometers, it is necessary to employ sequential plating 32a and 32b of magnetic and non-magnetic metals respectively, as shown in FIG. 8, in order to successfully contact the magnetic nanowires 18a and 18b for this experiment. Plated sections 32a and 32b of magnetic nanowires 18a and 18b are self-aligned with the molecules 30 of interest disposed between across the parallel gap.

Similar geometries are also used to also perform spin transport on other nanoscale materials such as fullerenes, quantum dots, and various types of colloids. In addition to the purely magnetic nanowire systems, various research fields have for some time also had interest in the use of narrowly spaced metallic nanowire systems, and magnetic nanowire manipulation and self-assembly can be used to construct coulomb blockade capacitors and analyze the influence of local impurities on conduction.

Another application of the invention is to experimental quantum computation. There has been a strong interest recently in obtaining parallel cylinder pairs for quantum gates. Such quantum-gate nanostructures could form a strongly coupled quantum waveguide systems.

Spin Transport Properties of Molecular Systems and Plasmonic Nanoresonators

To investigate spin transport properties of molecular systems, nanostructures as shown in FIG. 5a were built. Binding chemistry was developed to biofunctionalize magnetic nanowires 18a and 18b with sensing molecules of interest, and then nanomanipulation techniques were used to construct point contact probes 28. The nature of the resulting nanostructure is such that the conduction between the two nanowires 18a and 18b has to occur through the molecular system bound to the nanowires 18a and 18b. This is complemented by the magnetic character of the nanostructure, where the source and drain in this construction are magnetically tunable through an external field by using the mechanism described by the hysteresis loops of FIG. 5b. By combining these unique features of the magnetic nanowire point contact 20 and integration of molecules into that nanostructure spin transport spectroscopy can be performed through different molecules, i.e. through the current-voltage graphs of probe 28. The relatively open structure of the crossed nanomagnet point contact 20 makes this structure ideally suitable for sensing applications.

Another particularly interesting application of this unique geometry is the construction of an optical field enhancement device for Raman spectroscopy of molecules. In this device, molecules can be detected through plasmon resonant enhancement between two silver or gold nanowires 18a and 18b. By binding molecular systems to silver or gold nanowires 18a and 18b shown in FIG. 9a and joining two cylinders together magnetostatically as shown in FIG. 9b, one can expect to obtain large enhancements of the molecular Raman signal as shown in FIG. 9c.

Figure 9A:
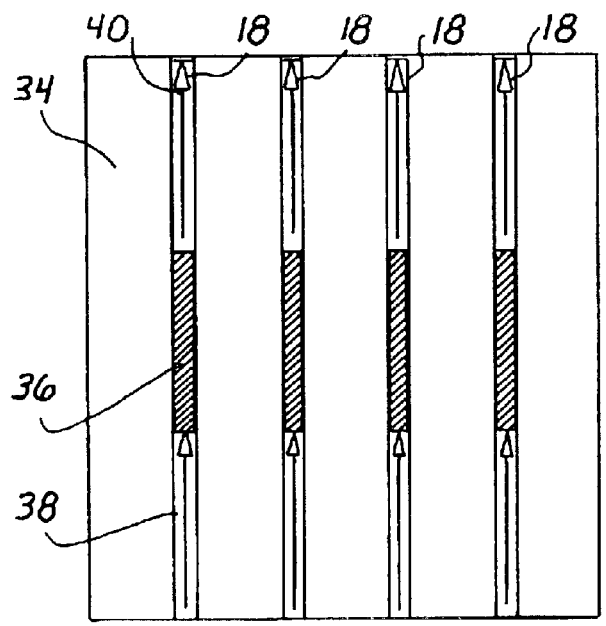
FIGS. 9a–c is a series of images showing the construction of an optical field enhancement device.
Figure 9B:
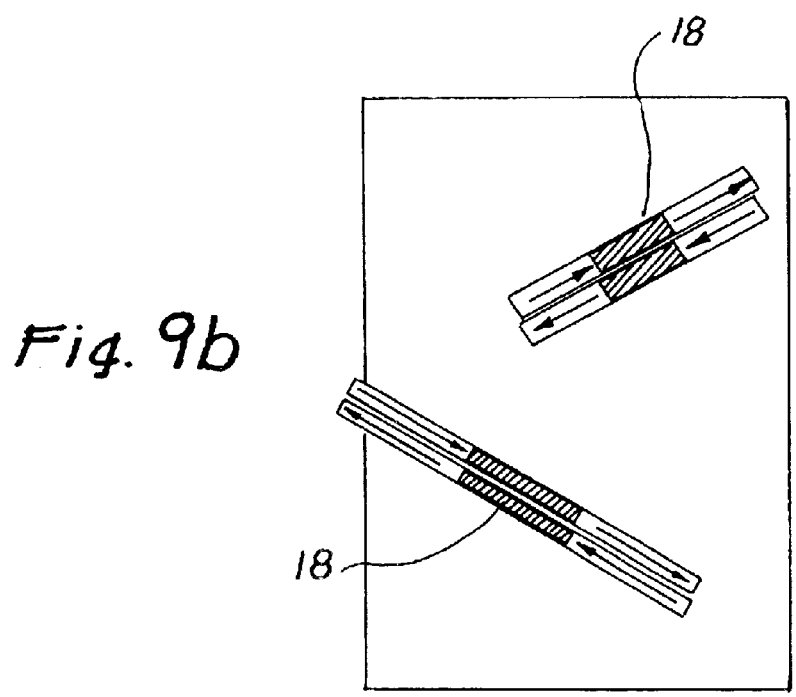
Figure 9C:
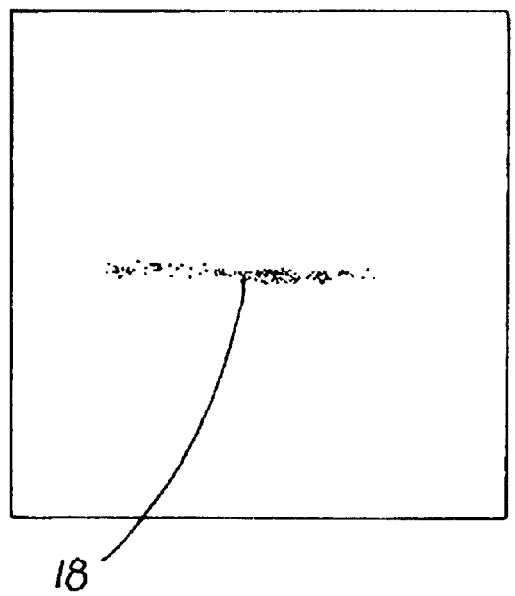

As shown in FIGS. 9a and 9b it is possible, by using magnetic nanowire the disclosed self-assembly method, to construct the necessary geometries to observe this effect as shown in FIG. 9c by sequential electrodeposition of nickel/silver/nickel metals. FIG. 9a is a side cross-sectional view, which shows the fabrication in a porous membrane 34 of a plurality of nanowires 18, which are fabricated to have a gold or silver midsection 36 and nickel magnetic ends 38. Membrane 34 is removed, such as by etching, setting wires 18 free. A thin coating of membrane 34 can be left on wires 18 if desired by control of the etching process. Wires 18 are then coated or bound to molecules of interest. Such prepared three-part nanostructures 38/36/38 or wires 18 are then be brought into contact with each other by self-assembly as shown in FIG. 9b with the midsections 36 adjacent and parallel to each other to create a parallel nanogap between them.

Figure 10A:
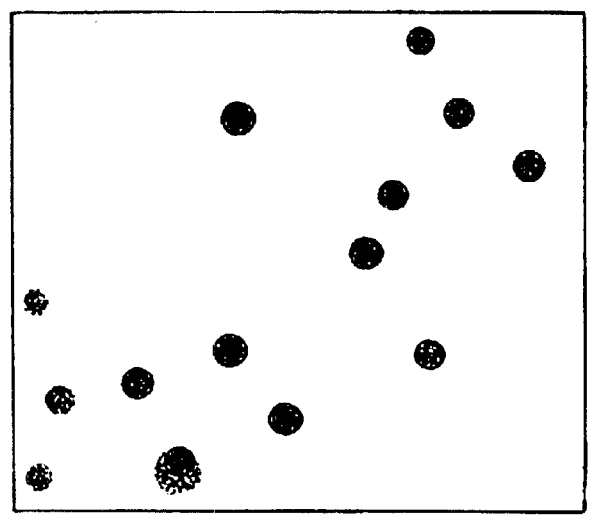
FIG. 10a is a dark field optical microphotograph of a colloidal suspension of silver nanoparticles.
Figure 10B:

Metal colloidal nanoparticles are becoming increasingly important in a variety of scientific fields. In molecular spectroscopy applications, the interest stems from the significant improvement in the detection of the Raman signal from molecules adsorbed on roughened metal surfaces. In the field of surface enhanced Raman scattering (SERS), the spectral signature from a single molecule has recently been observed. The plasmon resonance and the effective scattering cross section of individual silver nanoparticles, as well as their non-bleaching properties have significant potential for single molecule labeling based biological assays. Metal nanoparticles are also used in various near field optical microscopy applications where they provide increased signal output due to their efficient scattering properties. FIG. 10a shows a dark field optical microscopy image of colloidal silver particles, while FIG. 10b shows the TEM image of the same nanoparticles. These images vividly demonstrate the extremely efficient scattering properties of these nanoscopic metal particles, although they are below 100 nm in size.

Figure 11:
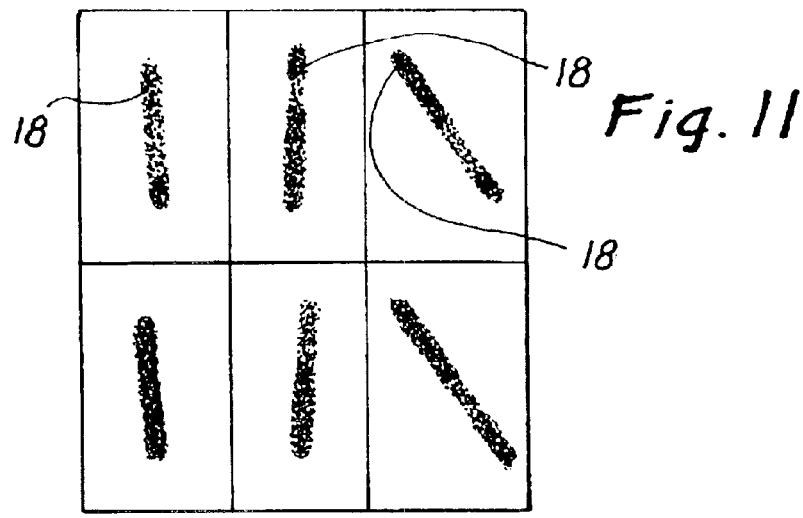
FIG. 11 is a series of optical microphotographs illustrating the plasmon resonance of silver nanowires in polarized light both perpendicular and parallel to the longitudinal axes of the nanowires.

As described in Barbic M., "*Single Crystal Silver Nanowire Prepared by the Metal Amplification Method,*" J. Appl. Physics, V. 91, No. 11, pp 9341 (2002) a single crystal of silver can be manufactured inside the pores of polycarbonate membranes. Strong scattering properties are realized from a single crystal of silver. FIG. 11 is a composite of multiple images showing the scattering properties of 50 nm diameter single crystal silver nanowires 18. Fabrication of silver nanowires 18 has a special significance in optical applications, since optical properties of silver show superior properties compared to that of any other metals with respect to the losses in the localized surface plasmon resonance, or in the propagation of the one-dimensional surface plasmons. Silver nanowires 18 also have a very large scattering cross-section due to the plasmon resonance condition that occurs at optical wavelengths. The top row of images of FIG. 11 shows a typical optical microscopy image of three individual single crystal silver nanowires 18 illuminated by polarized white light with the electric field vector perpendicular to the nanowire's longitudinal axis. The nanowires 18 are actually violet in color due to the plasmon resonance band which appears in the near UV visible spectral range. The bottom row of FIG. 11 shows an image of the same three nanowires 18 when the polarization direction is along the nanowire long axis where the particles will now appear reddish.

Integration of such novel nano-optical systems with our nanomagnetic technologies allows us to construct truly unique multifunctional nanostructures as described below. In addition to the unique conductance measurements in atomic point contacts 20 as described above made possible by the development of the magnetic nanowire fabrication, manipulation, and self-assembly methods, integration of magnetic structures with nanoscopic optical systems provides another unique concept that is important in the development of a probe for imaging and detection of single spin with atomic three-dimensional resolution through magnetic resonance imaging techniques.

Magnetic resonance imaging has a remarkable history starting in 1973, when two independent and pioneering papers by Lauterbur, and Mansfield et. al. reported on applying magnetic field gradients to samples in order to demonstrate magnetic resonance imaging of spatial electron spin distribution. Since then, magnetic resonance imaging (MRI) has become a well-established three-dimensional visualization technology with tremendous impact on clinical medicine. Although improvements in imaging resolution have steadily progressed in the last three decades, the current spatial resolution is limited to approximately 1 $\mu$m due to the low energy photons involved in the magnetic resonance process. This is contrasted by other imaging technologies, such as electron microscopy and various scanning probe microscopies that have provided atomic resolution. Scanning probe techniques have also been extended to surface atomic resolution magnetic imaging and surface magnetic resonance spin imaging.

Figure 12:
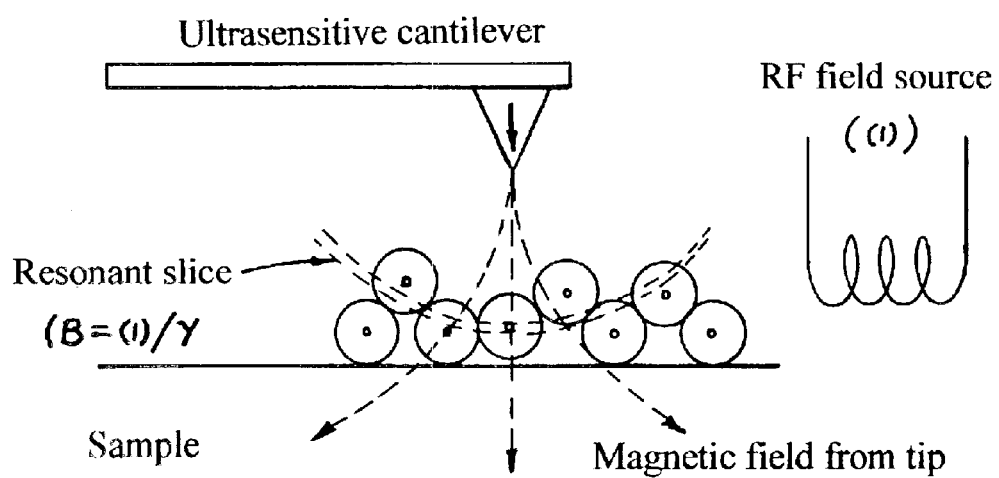
FIG. 12 is a diagrammatic sideview of the sensing tip of a magnetic resonance force microscope.

Motivated by the potential of combining three-dimensional imaging capability of conventional magnetic resonance and the atomic resolution of scanning probe techniques that utilize mechanical cantilevers, a unique atomic resolution three-dimensional magnetic resonance imaging technique can be realized. This prior art method, shown diagrammatically in FIG. 12, known as the magnetic resonance force microscopy (MRFM), uses a microscopic magnetic particle as a source of atomic scale imaging gradient fields and a mechanical resonator as a sensitive detector of magnetic resonance. This instrument marks a change in direction in magnetic resonance detection from the standard inductive techniques. Proof-of-concept demonstrations of the technique have been carried out in the art for various magnetic resonance systems including electron spin resonance, nuclear magnetic resonance, and ferromagnetic resonance. While this technique is rapidly progressing by the incorporation of smaller magnetic particles and more sensitive mechanical resonators, current MRFM imaging resolution of ~1 $\mu$m remains at the level of conventional MRI inductive detection.

Although progress in MRFM detection has reached sub-atto-newton force sensitivity, detection of single nuclear or even electron spin using a mechanical detection remains a formidable challenge for the nano-fabrication community. This challenge is amplified with the requirements that the suitable detector of single spin has to incorporate all the necessary MRFM components: namely a nanomagnetic particle, a nanoresonator, an appropriate method of actuation, and an appropriate method of detection, all in a nanoscale package.

These requirements are met in illustrated embodiment by a multi-layer nanowire sensor that integrates a nanowire cantilever resonator structure, nanomagnet for ultrahigh gradient fields, and a metal colloidal nanoparticle as an efficient optical nanoreflector for appropriate vibration detection. This is only possible because of the integration of plasmonic colloids into magnetic nanowires according to the invention. Although this property of colloidal silver and gold particles has been known for more than a 100 years, the disclosed nanofabrication methods provide a remarkable advance for using such bright nanoscopic optical scatterers in novel spin imaging applications.

FIG. 13a illustrates the point by showing the disclosed method of integrating a 150 nm diameter spherical silver metallic nanoparticle 40 onto a 40 nm diameter nickel nanowire 18. The significance of this development is demonstrated in FIG. 14b where an optical micrograph of the nanostructure 40, 18 of FIG. 13a is shown. One observes the substantial enhancement of the light scattered from such a nanostructure 40, 18. The attractive part of this nanostructure 40, 18 is that the silver nanosphere 40 does not add almost any significant mass to the nanowire 18, but has a significantly increased scattering cross section due to its plasmon resonance when illuminated by the optical field in the visible spectral range. Such a nanoparticle 40 can therefore serve as an extremely efficient nanoreflector for sensitive optical investigation of nanowire vibration critically needed in an MRFM potentially capable of single electron spin detection.

Combining this optical feature with the single domain magnetic properties of the nickel nanowire 18 also allows for unique opportunity for magnetic actuation of this nanostructure 40, 18. Fabrication and readout of devices with progressively smaller size, ultimately down to the molecular scale, is critical for the development of very high frequency nanoelectromechanical systems (NEMS).

Figure 15:
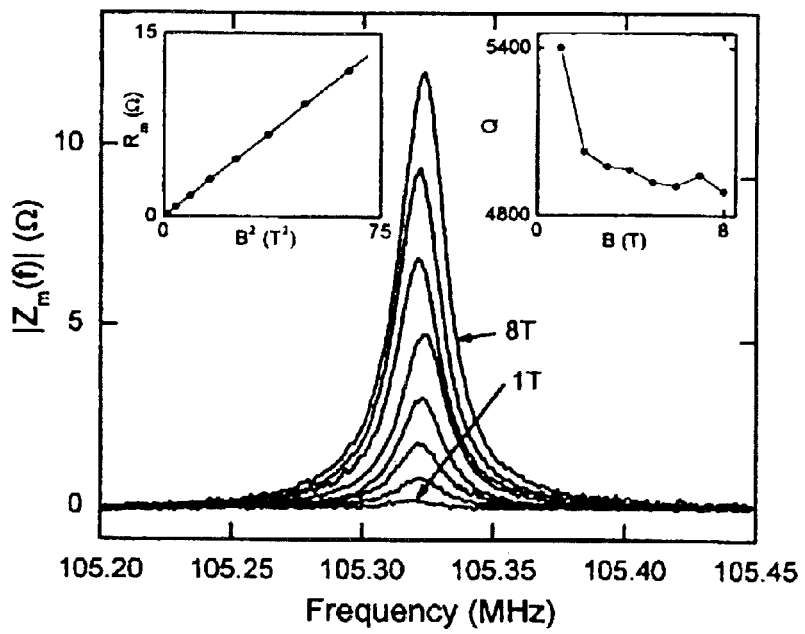
FIG. 15 is a graph of the resonance curve of the resonator of FIGS. 14a and 14b.
Figure 14A:
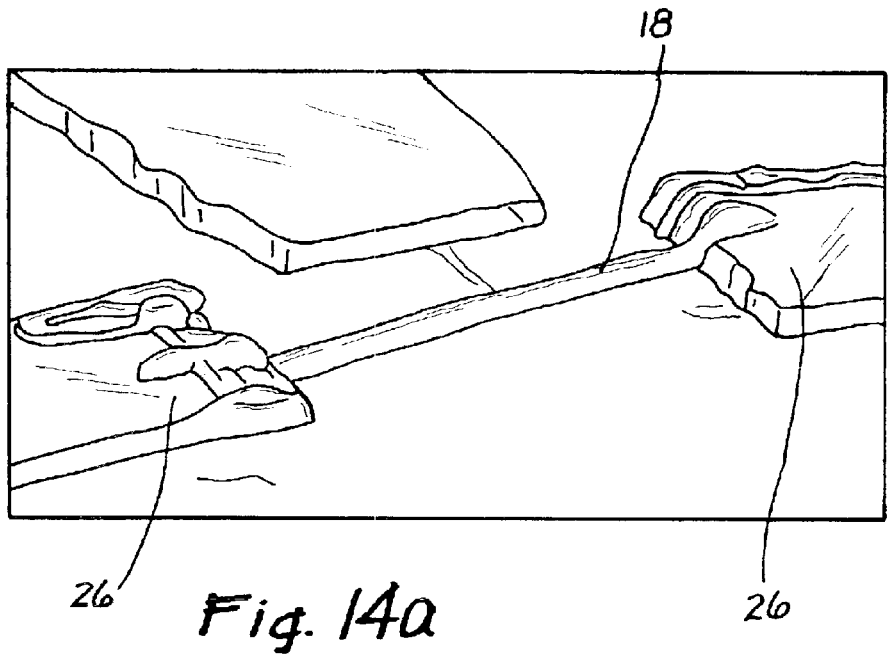
FIG. 14a is a scanning electron microphotograph of a platinum nanowire resonator.
Figure 14B:
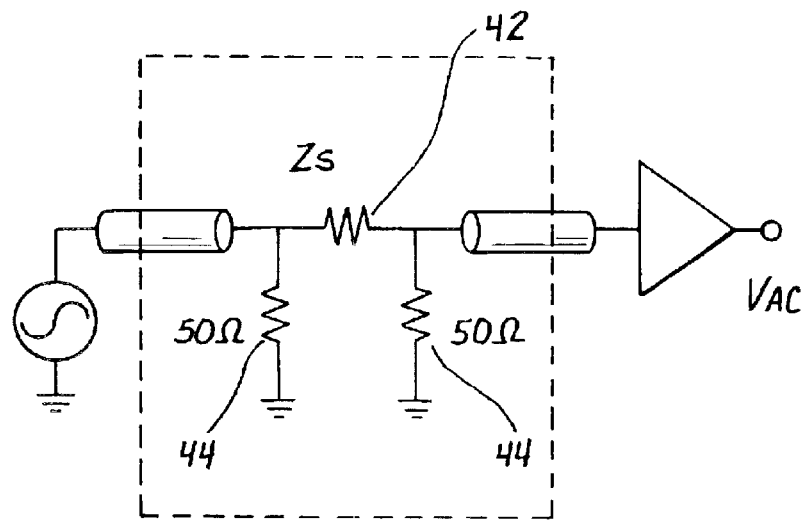

For example, we have recently fabricated and measured a platinum nanowire resonator, 43 nm in diameter and 1.3 micron in length as shown in the SEM photograph of FIG. 14a, which has the equivalent circuit of the schematic of FIG. 14b, namely a $\pi$ resistive network comprised of a sensing impedance 42, $Z_s$, grounded by two 50 ohm impedances 44. This device, among the smallest NEMS ever reported, was fabricated by electroplating platinum into a porous polycarbonate membrane. It has a fundamental vibration frequency of 105.3 MHz, with a quality factor of 5000 at 4 K as shown in the graph of FIG. 15. Such nanomechanical cantilever is modified in the illustrated embodiment through the addition of plasmon scatterers and magnetic nanoparticles, with the goal of defining an ultra-compact nano-MRFM probe.

We first suspend the structure 40,18 shown in FIG. 13a by using conventional high-resolution electron beam lithography and nanofabrication methods. FIGS. 16a–17h diagrammatically depict the fabrication procedure for suspending a plasmon tipped nanowire 40, 18 over a surface for subsequent optical detection of vibration. The process begins in FIG. 16a with a thin glass slide 46 on which a sacrificial silicon layer 48 is grown as shown in FIG. 16b. Plasmon tipped nanowire 40, 18 is deposited on layer 48 as shown in FIG. 16c. Electron beam lithography and thin film deposition disposes a sacrificial layer 50 shown in FIG. 16d embedding nanowire 40, 18. Selective photolithography is used to open a window 52 as shown in FIG. 16e exposing an end 54 of wire 18. A contact layer 56 is disposed into window 52 to embed end 54 as shown in FIG. 16f. All disposed layers, but contact layer 56 in window 52 are removed leaving wire 18 disposed on layer 48 and an end of wire 18 carrying nanosphere 40 extending over layer 48 as shown in FIG. 16g. Layer 48 is then removed except for that portion under contact layer as shown in FIG. 16h. This final etching of sacrificial layer 48 results in the release of nanowire 18, 40 cantilevered over glass slide surface 46 as shown in FIG. 16h.

The interference instrument as diagrammatic shown in FIG. 17 is based on conventional optical designs for measuring the vibration magnetic/plasmonic nanostructures. In a geometry similar to fiber-optic interferometry, a laser beam 58 is focused onto plasmon particle or nanosphere 40 located on the end of nickel nanowire 18. Part of the laser light is reflected at the glass/air interface 60, and more of the laser light will be efficiently reflected from of the plasmonic particle or nanosphere 40 at the end of the nanowire 18. These two reflecting beams will interfere and provide a reflection or transmission signal change due to the nanowire vibration. Nanowire 18 is vibrated by incorporating microcoils 62 around wire 18, where the single domain magnetic nature of nickel nanowire 18 allows for application of a driving torque on nanowire 18. The set-up will initially be placed in a vacuum microchamber 64 in order to reduce air damping on the nanoresonator 18, 40, 62. A long working distance optical microscope objective 66 is placed above the experimental set-up to observe and precisely manipulate the focusing of the probing laser beam 58 onto the plasmon resonant particle at the end of nanowire 18 through lens 68.

Since a nano-coil can be used to actively deflect the cantilevered nanowire 18, it becomes also possible to perform in-situ measurements within a fluidic sample. In such measurements, it is necessary to compensate for the mechanical damping of the mechanical resonator motion by the molecules surrounding the cantilevered nanowire 18. The damping is counteracted by using "active" modulation from electromagnetic coil 62. The effective quality factor of the nanomechanical resonator 18, 40, 62 is thereby electronically controlled, permitting accurate microbalance and magnetic resonance experiments.

Figure 18:
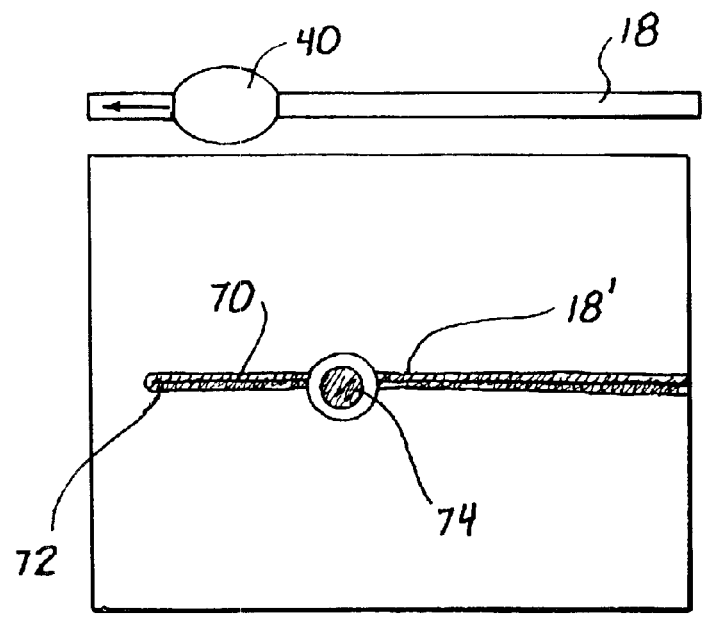
FIG. 18 is a scanning electron microphotograph of a single spin detector.

Although a simple two component nanoresonator system for the simplest but important development of optical detection of nanowire vibration, multi-component nanowires can also be fabricated and will allow realization of a nanoresonator system for single electron spin imaging and detection in a MRFM configuration. FIG. 18 shows a single spin detector nanoresonator structure 70 where a cantilever or nanowire resonator portion 18' is composed of a nonmagnetic material such as platinum. On the end of the nanowire 18' is a single domain nanowire magnet 72 that provides the required ultra-high gradient magnetic fields for single spin selection and force detection. The nanoresonator structure 70 of FIG. 18 also incorporates a plasmon resonant colloidal nanoreflector 74 for optical detection of the single spin detector vibration, which colloidal nanoreflector is composed of silver.

Figure 19:
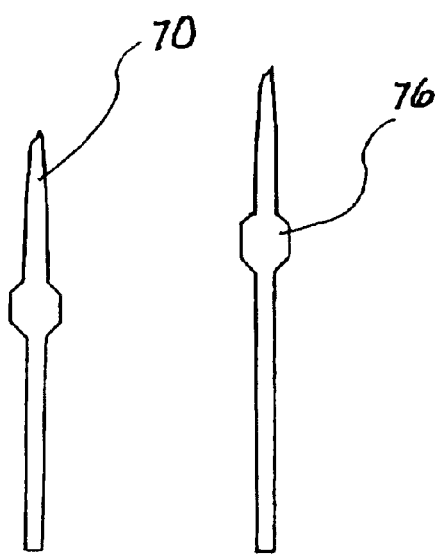
FIG. 19 is a scanning electron microphotograph of a prior art magnetic resonance force microscopic sensor.

FIG. 19 shows a multi-component nanowire 18' with the above disclosed components integrated into a single nanoresonator sensor 70. In contrast, to the right is a photograph of the most sensitive MRFM detector 76 used to date. The discrepancy of the scale of sensor 70 and detector 76 prevents actual graphic comparison, but there is a 100-fold reduction in size of nanoresonator sensor 70 relative to the smallest prior art MRFM detector 76, demonstrating the potential of significantly reducing the size, and therefore, dramatically increasing the spin sensitivity to a single electron spin detection level.

The measurement of vibration of nanoscopic structures is an emerging field in mesoscopic physics. Optical investigation of such nanostructures is a significant advancement. The concept of an optical detection of mechanical nanoresonators also opens the possibility of investigating the unexplored physical regimes where the interaction of light and mechanical nanoresonators might provide new insights into the quantum mechanical interplay of such systems. Scientific fields that study the interaction of nanoscopic ferromagnetic objects mounted on nanoscopic cantilevers which interact with the discrete spins of a crystal lattice are likely to greatly benefit from the present invention, most notably in the field of spin quantum computation.

Ultra-Sensitive Micro-Coil Structures for High Resolution MRI

In addition to the cantilever-based detection in magnetic resonance imaging as disclosed above, inductive detection techniques using unique micro-coil designs are contemplated as within the scope of the invention. Advances in magnetic resonance spectroscopy and microscopy have recently been accelerated by the implementation of microcoil detectors. Magnetic resonance imaging is combined with the complex microcoil fabrication to achieve submicron MRI resolution. This traditionally spatial-resolution-limited imaging technology is thus brought to the same performance level as, for example, optical microscopy, while still maintaining all the advantages of MRI in biological studies such as noninvasive, three dimensional, and chemical contrast imaging capability. Such achievement allows access to the studies of subcellular systems and opens new avenues in biological research.

Figure 20:
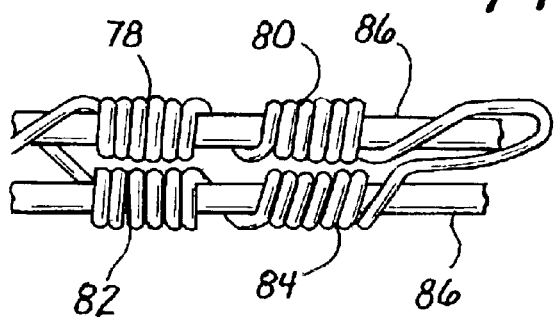
FIG. 20 is a sideview microphotograph of an ultra-high gradient field coil assembly for use in magnetic resonance imaging at the submicron level.

As shown in FIG. 20 four coils 78, 80, 82 and 84 are wound on a single 65-micron diameter optical fiber 86, which is then folded into an appropriate gradient arrangement, as shown in FIG. 20 in which coils 78, 80 are brought adjacent and parallel to coils 82 and 84. Such a design provides ultra-high magnetic field gradients on the order of 100,000 Gauss/cm for a single imaging direction, while simplifying the connector design by using only two leads for a four-coil arrangement, namely the leads to coils 78 and 82 since all the coils 78, 80, 82 and 84 are would serially from a single wire. By constructing such an arrangement for both x- and y-directions, and a standard micro-coil Maxwell arrangement for the z-imaging direction, one could achieve imaging resolution bellow 250 nm. Similar RF micro-coil arrangement with the appropriate current phases though the coils would provide sufficient RF field magnitude and sensitivity for a sufficient signal-to-noise ratio to support such ultra-high MRI spatial resolution.

Figure 21:
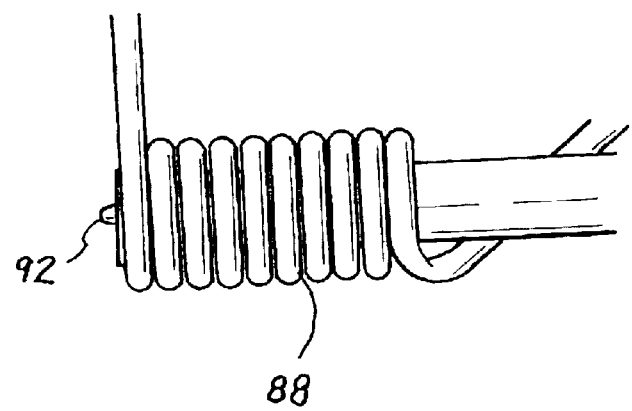
FIG. 21 is a sideview microphotograph of an integrated microsphere and microcoil for use in scanning probe magnetic resonance imaging at the submicron level.

Two embodiments are illustrated namely: (a) appropriate sub-100 micron diameter micro-coil assemblies for application of uniform RF fields and ultra-high gradient DC magnetic fields; and (b) micro-coil structures integrated with ferromagnetic micro-particles for application of ultra-high gradient magnetic fields in a scanning probe magnetic resonance microscopy implementation. FIG. 20 shows a photograph of a four-coil gradient field assembly for the achievement of the first embodiment. FIG. 21 is a photograph of an integrated magnetic micro-sphere and micro-coil, collectively denoted by reference numeral 88 for scanning probe microscopy MRI, which shows an example of a micro-coil 88 wound near the end of a cleaved 65-micron diameter optical fiber 90. We have placed a 15-micron diameter nickel micro-sphere 92 at the end of optical fiber 90 for applying extremely large imaging gradient fields to the samples. This arrangement is very attractive for applications reminiscent of the well-known stray field MRI (STRAFI) techniques, but with an important advantage of the ability to apply very localized imaging gradients to the sample. Implementing such a probe in a scanning probe mode provides a new tool for MRI biological studies.

Figure 22:
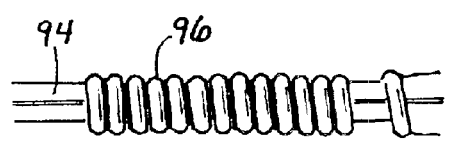
FIG. 22 is a sideview microphotograph of an integrated ferromagnetic core capillary tube with a microcoil wound thereon for use in magnetic resonance imaging at the submicron level.

The integration of ferromagnetic nano-particles with MRI detectors is critical for achieving the ultimate MRI goal of atomic resolution. To this end, we have also recently achieved further miniaturization of the micro-coil structures into the sub-50 micron regime that will provide us with further sensitivity improvements. FIG. 22 shows a 25-micron diameter capillary tube 94 wound with a 12-micron diameter magnet wire 96. In addition to the miniaturization of the coil flux detector, we have also further increased the imaging gradients by filling capillary tube 94 with a ferromagnetic material that can be submicron in diameter. This allows us to reach local submicron ultra-high gradient fields required for subcellular imaging resolution in a biological scanning probe microscopy instrument. The improvement of the resolution of MRI techniques to 100 nm is expected to enable nondestructive analysis and an in-depth understanding of cellular development. The cells to be analyzed in the nanocoil arrangement are delivered by using nanofluidic methods, which permit biological samples to be extracted, concentrated and held in place within ambient nutrients for nano-MRI analysis.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A magnetic nanoprobe enabling in magnetic micromanipulation comprising:
    a micron-sized soft-ferromagnetic wire serving as a magnetic core;
    a micron-sized coil wound around the magnetic core; and
    a sharp tip defined on a distal end of the magnetic core where the micron-sized magnetic core has a diameter of 100 $\mu$m or less, wherein the micron-sized coil is comprised of magnet wire having a diameter of 50 $\mu$m or less, and wherein the sharp tip defined on a distal end of the magnetic core is formed by electrochemical etching.

2. A magnetic nanoprobe enabling in magnetic micromanipulation comprising:
    a micron-sized soft-ferromagnetic wire serving as a magnetic core;
    a micron-sized coil wound around the magnetic core; and
    a sharp tip defined on a distal end of the magnetic core where the micron-sized coil is comprised of at least two layers of wire coils.

3. A magnetic nanoprobe enabling magnetic micromanipulation comprising:
    a micron-sized soft-ferromagnetic wire serving as a magnetic core;
    a micron-sized coil wound around the magnetic core; and
    a sharp tip defined on a distal end of the magnetic core.

4. A nanoelectromagnetic mechanical apparatus comprising:
    a plurality of nanoprobes combined to form a nanoelectromagnet assembly; and
    at least one magnetic nanowire disposed proximate to the nanoelectromagnet assembly and electromagnetically coupled thereto.

5. The nanoelectromagnetic mechanical apparatus of claim 4 where the nanoelectromagnet assembly is arranged and configured to serve as a stator, and where the nanowire serves as a rotor.

6. The nanoelectromagnetic mechanical apparatus of claim 4 where the nanoelectromagnet assembly is arranged and configured to serve as a solenoid coil, and where the nanowire serves as an actuator.

7. The nanoelectromagnetic mechanical apparatus of claim 4 where the nanoelectromagnet assembly is arranged and configured to serve as a relay coil, and where the nanowire serves as a relay contact.

8. An apparatus for providing a nanogap point contact comprising:
    a first magnetic nanowire having at least one associated electrical contact; and
    a second magnetic nanowire disposed askew to the first magnetic nanowire to form a crossing therebetween and having at least one associated electrical contact, the first and second nanowires touching or nearly touching each other at the crossing, so that magnetoresistance between the first and second nanowires can be measured.

9. The apparatus of claim 8 where at least one of the first and second nanowires is covered with a molecular substance, whose spin transport properties is to be measured.

10. The apparatus of claim 9 where at least one of the first and second nanowires is covered by a thin film of the molecular substance.

11. The apparatus of claim 8 where the crossing of the first and second magnetic nanowires is approximately at right angles and their touching or near touching comprises a point contact.

12. The apparatus of claim 11 where the point contact is capable of single molecule interrogation.

13. The apparatus of claim 8 where the first and second magnetic nanowires are each single domain magnets.

14. The apparatus of claim 13 where the first and second magnetic nanowires each have a longitudinal axis and the single domain magnets are oriented along the longitudinal axis at zero applied magnetic field.

15. The apparatus of claim 14 further comprising a source of an external applied magnetic field and wherein one of the first and second magnetic nanowires has its longitudinal axis substantially perpendicular the external applied magnetic field.

16. An apparatus for providing a nanogap comprising:
a first magnetic nanowire having at least one associated longitudinal length; and
a second magnetic nanowire having at least one associated longitudinal length, the second magnetic nanowire disposed substantially parallel to the first magnetic nanowire by at least in part magnetic self-assembly to form the nanogap between at least a portion of their longitudinal lengths, the first and second nanowires touching or nearly touching each other.

17. The apparatus of claim 16 further comprising an electrical contact coupled to each of the first and second nanowires, such that the nanogap between them forms an electron tunneling junction.

18. The apparatus of claim 17 where the nanogap is approximately 10 nm across or less.

19. The apparatus of claim 17 further comprising a coating of a molecular substance of interest on at least one of the first and second magnetic nanowires so that the electron tunneling junction is formed through the molecular substance of interest.

20. The apparatus of claim 16 further comprising longitudinally sequential plating of the first and second nanowires with magnetic and nonmagnetic material to assist in control of the magnetic self-assembly of the first and second nanowires.

21. The apparatus of claim 16 where the first and second nanowires are comprised at least in part of gold or silver for enhanced molecular Raman signals when aligned.

22. The apparatus of claim 21 where the first and second nanowire is comprised of a sequential electrodeposition of nickel, silver or gold and nickel portion.

23. The apparatus of claim 22 further comprising a coating of a molecular substance of interest on at least one of the first and second nanowires, including at least part of the silver or gold portion.

* * * * *